United States Patent [19]

Yamaguchi

[11] Patent Number: 4,835,788
[45] Date of Patent: May 30, 1989

[54] DISTRIBUTED FEEDBACK SEMICONDUCTOR LASER

[75] Inventor: Masayuki Yamaguchi, Tokyo, Japan

[73] Assignee: Nec Corporation, Tokyo, Japan

[21] Appl. No.: 213,948

[22] Filed: Jul. 1, 1988

[30] Foreign Application Priority Data

Jul. 1, 1987 [JP] Japan ................................ 62-165690

[51] Int. Cl.$^4$ .............................................. H01S 3/19
[52] U.S. Cl. ....................................... 372/96; 372/46; 372/48
[58] Field of Search ....................... 372/96, 48, 45, 46, 372/50

[56] References Cited

U.S. PATENT DOCUMENTS 4,751,710  6/1988  Yamaguchi et al. .................. 372/50

Primary Examiner—James W. Davie
Attorney, Agent, or Firm—Sughrue, Mion, Zinn, Macpeak & Seas

[57] ABSTRACT

A distributed feedback semiconductor laser is provided with first and second grooves, a mesa stripe which is positioned between the first and second grooves, and a third groove communicating to the first and second grooves and positioned behind a mesa stripe edge at which the mesa stripe is terminated. Each of the first and second grooves and of the third groove is formed beyond an active layer from a cladding layer. A width of mesa stripe is narrowed continuously at the mesa stripe edge in a direction of the third groove, a width of the third groove is narrower than the sum of widths of the first and second grooves and the mesa stripe, and edges of the first and second grooves and of the third groove are defined to be of a continuous shape. As a result, a leakage current is avoided to be flowed outside the active layer in the mesa stripe so that an oscillation threshold current is lowered even if the distributed feedback semiconductor laser is provided with a window region.

2 Claims, 4 Drawing Sheets

FIG. IA PRIOR ART
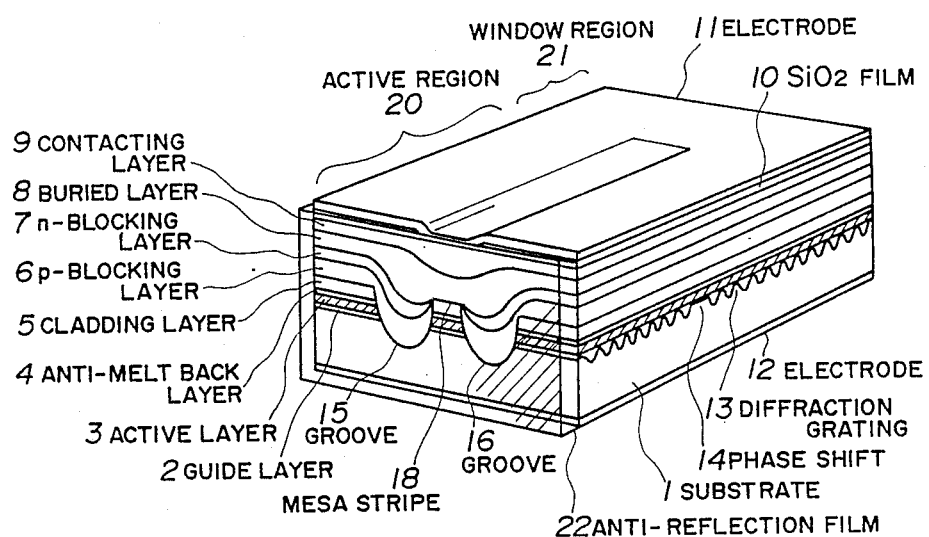
FIG. IB PRIOR ART
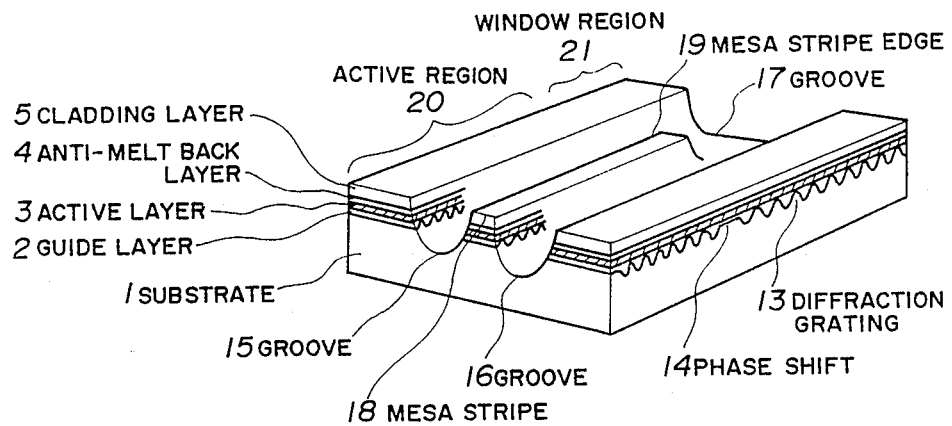

DISTRIBUTED FEEDBACK SEMICONDUCTOR LASER

FIELD OF THE INVENTION

The invention relates to a distributed feedback semiconductor laser, and more particularly to a distributed feedback semiconductor laser in which a high yield is obtained in fabricating the same and an oscillation is performed with a low threshold current.

BACKGROUND OF THE INVENTION

Research and development of a phase shifted distribution feedback semiconductor laser (simply called "a phase shifted-DFB laser hereinafter) in which a diffraction grating having a λ/4 shift in the axial center of an active region is formed has been continued because such a phase shifted-DFB laser is used for a light source adapted to a long distance and large capacity communication using an optical fiber for the reason why a stable oscillation can be performed with a single wavelength in the DFB laser even under direct modulation. Advantages of a phase shifted-DFB laser as compared to a DFB laser having a continuous diffraction grating is that a stable single wavelength oscillation in which a sub-mode is sufficiently suppressed can be performed because a threshold gain difference is large between main and sub-modes even at a modulating time, and that a high yield is obtained in being fabricated. For the reasons, development and practical use of the phase shifted-DFB laser are strongly desired in view of an application thereof to an optical system and a fabrication of devices.

A kind of a phase shifted-DFB laser was fabricated for research and development by the inventor. The phase shifted-DFB laser was fabricated in following procedures. That is, a guide layer of n-InGaAsP having a thickness of 0.1 μm, an active layer of non-doped InGaAsP having a thickness of 0.1 μm, anti-melt back layer having a thickness of 0.03 μm, and a cladding layer of p-InP having a thickness of 1 μm were grown on an n-InP substrate of (001) plane orientation having a diffraction grating with a λ/4 shift which is parallel to a crystal orientation of [110] plane by liquid phase epitaxy, and a mesa stripe were then formed at a portion corresponding to an active region of a multi-layer semiconductor crystal to be positioned between two parallel grooves each having a depth of 3 μm along [110] orientation. In a window region, no mesa stripe was formed, and a groove was provided with a width equal to the sum of width of the two parallel grooves and the mesa stripe. The two parallel grooves were communicated to the groove at a position where the mesa stripe was terminated. Then, current blocking layers of p-InP and n-InP were grown except for above of the mesa stripe, and a buried layer of p-InP and a contacting layer of p+-InGaAsP were grown on a whole surface of the blocking layer and the mesa stripe. Thereafter, a SiO₂ film was grown on the contacting layer except for a portion corresponding to the mesa stripe, and a pair of electrodes were provided on upper and back surfaces of a multi-layer semiconductor as processed above. Finally, a one side facet of the multi-layer semiconductor on which the active region was positioned was coated with an anti-reflection film to complete the phase shifted-DFB laser.

According to the observation of phase shifted-DFB lasers thus fabricated, a yield of 100% is obtained in fabricating the phase shifted-DFB lasers each having a property of a single wavelength oscillation.

However, a high oscillation threshold current is required to be 40 mA much higher than 20 mA which is that of a DFB laser having no window region due to leakage current flowing outside the active layer in the mesa stripe, although the more detailed reason which is analyzed in an experiment by the inventor will be explained later.

SUMMARY OF THE INVENTION

Accordingly, it is an object of the invention to provide a phase-shifted distributed feedback semiconductor laser in which a high yield is obtained in being fabricated.

It is a further object of the invention to provide a phase-shifted distribution feedback semiconductor laser in which leakage current is avoided to be flowed outside an active layer thereof.

It is a still further object of the invention to provide a phase-shifted distributed feedback semiconductor laser in which an oscillation threshold current is lowered even if a window region is provided therein.

According to the invention, a phase-shifted distributed feedback semiconductor laser comprises, an optical guide layer of a periodical convex and concave structure provided on a semiconductor substrate of a first conduction type, an active layer for radiating light, said active layer being positioned above said optical guide layer, a cladding layer being positioned above said active layer, first and second grooves each having a depth beyond said active layer, a mesa stripe being positioned between said first and second grooves and terminated at a mesa stripe edge, a third groove having a depth beyond said active layer and being communicated to said first and second grooves at said mesa stripe edge, two current blocking layers of a second conduction type and said first conduction type, said two blocking layers being sequentially provided above said cladding layer, said first and second grooves and said third groove except for above said mesa stripe, a buried layer being provided above said current blocking layer of said first conduction type, and electrode means for applying predetermined voltage which is necessary for radiating said light from said active layer, wherein a width of said mesa stripe is narrowered continuously at said mesa stripe edge in a direction of said third groove, a width of said third groove is narrower than the sum of widths of said first and second grooves and said mesa stripe, and edges of said first and second grooves and of said third groove are defined to be of a continuous shape.

BRIEF DESCRIPTION OF DRAWINGS

The invention will be explained in more detail in conjunction with appended drawings wherein, FIG. 1A is a perspective view showing a conventional phase-shifted distributed feedback semiconductor laser which was fabricated by the inventor, FIG. 1B is a perspective view showing a process for fabricating the conventional phase-shifted distributed feedback semiconductor laser in FIG. 1A.

DESCRIPTION OF PREFERRED EMBODIMENTS

Figure 1C:
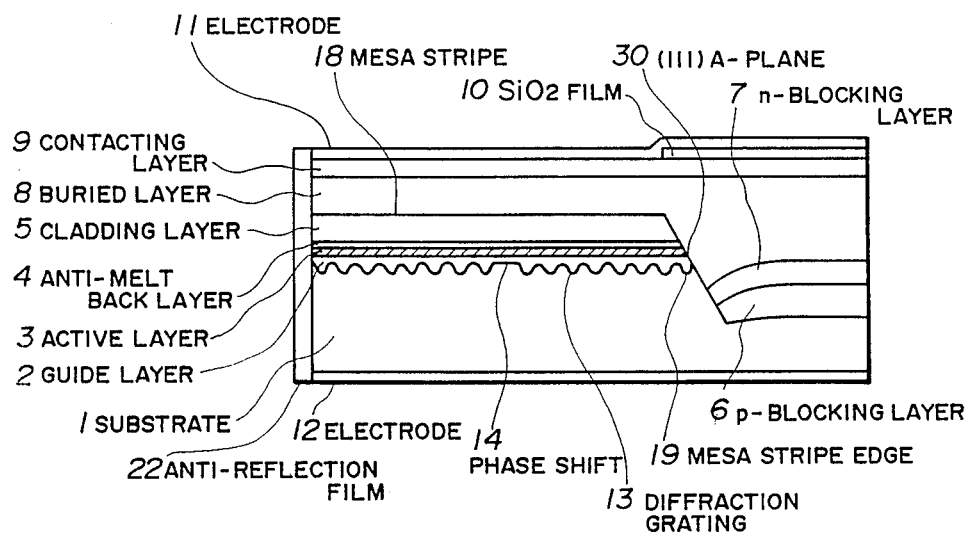
FIG. 1C is a cross-sectional view showing the conventional phase-shifted distributed feedback semiconductor laser in FIG. 1A.

Before explaining a phase shifted distributed feedback semiconductor laser in an embodiment according to the invention, a conventional phase shifted-distributed feedback semiconductor laser which was briefly explained before will be explained in conjunction with FIGS. 1A to 1C.

In FIG. 1A, there is shown the phase-shifted distributed feedback semiconductor laser which is based on a double channel planer buried heterostructure (simply called "DC-PBH structure" hereinafter), and referred to as a phase shifted-DFB-DC-PBH laser in following descriptions. As shown in FIG. 1A, the phase shifted-DFB-DC-PBH laser is provided with an active region 20 formed at front and center portions thereof and a window region 21 formed at a rear portion thereof, and further provided with an anti-reflection film 22 formed on a facet of a front side thereof. In the phase shifted-DFB-DC-PBH laser, a reflection on a facet thereof is avoided in the presence of the window region 21, and an optical coupling of an aptical fiber is effectively performed with a front facet thereof because the facet is coated with the anti-reflection film 22.

In FIG. 1B, there is explained a process for fabricating the phase shifted-DFB-DC-PBH laser in FIG. 1A. At first, a guide layer 2 of n-InGaAsP having a thickness of 0.1 μm, an active layer 3 of non-doped InGaAsP having a thickness of 0.1 μm, anti-melt back layer 4 having a thickness of 0.03 μm and a cladding layer 5 of p-InP having a thickness of 1 μm are grown on an n-InP substrate 1 of (001) plane orientation having a diffraction grating 13 with a λ/4 shift 14 with a parallel to a crystal orientation of [110] plane by liquid phase epitaxy, and a mesa stripe 18 are then formed at a portion corresponding to an active region of a multi-layer semiconductor crystal to be positioned between two parallel grooves 15 and 16 each having a depth of 3 μm along [110] orientation. In the window region 21, no mesa stripe is formed, and a groove 17 is provided with a width equal to the sum of width of the two parallel grooves 15 and 16 and the mesa stripe 18. The two parallel grooves 15 and 16 are communicated to the groove 17 at a position where the mesa stripe is terminated at a mesa stripe edge 19. Then, current blocking layers 6 and 7 of p-InP and n-InP are grown on the cladding layer 5 except for above the mesa stripe 18, and a buried layer 8 of p-InP and a contacting layer 9 of p+-InGaAsP are grown on a whole surface of the blocking layer 7 and the mesa strip 18. Thereafter, a SiO2 film 10 is formed on the contacting layer 9 except for a portion corresponding to the mesa stripe 18, and a pair of electrodes 11 and 12 are provided on upper and back surfaces of a multi-layer semiconductor as processed above. Finally, a one side facet of the multi-layer semiconductor on which the active region 20 is positioned is coated with an anti-reflection film 22 to complete the phase shifted-DFB-DC-PBH-laser.

An oscillation spectrum was observed in each of phase shifted-DFB-DC-PBH lasers as fabricated above, and it was confirmed that a yield of 100% was obtained in fabricating the phase shifted-DFB-DC-PBH lasers each oscillating with a single wavelength. However, it was measured that an oscillation threshold current of approximately 40 mA is required to be injected thereinto as compared to an oscillation threshold current of 20 mA which is required for a DFB laser having no window region 21.

Figure 3:
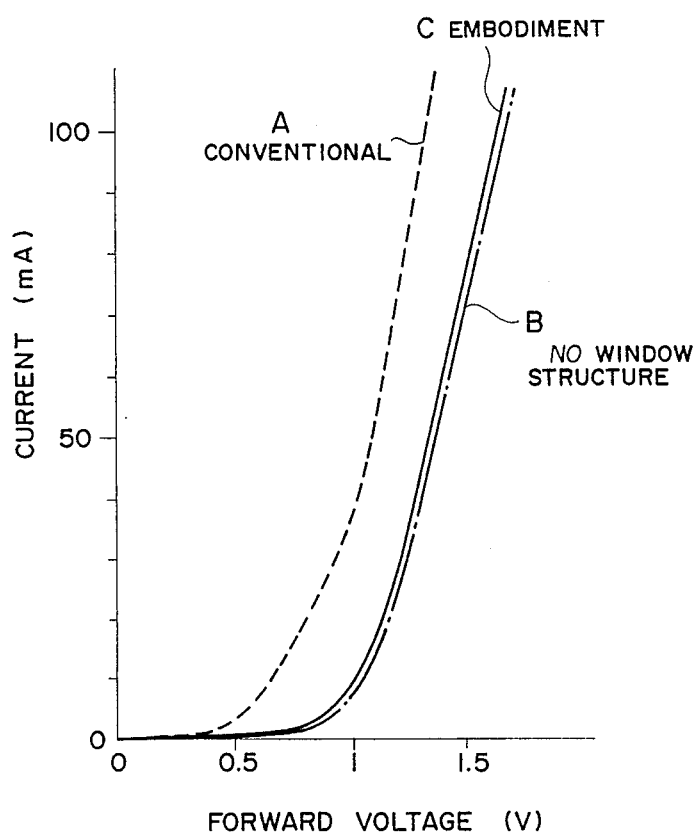
FIG. 3 is an explanatory diagram showing current-voltage characteristics of three types of phase shifted distributed feedback semiconductor lasers.

In FIG. 3, there are three current-voltage characteristics A, B and C of a phase shifted-DFB laser shown in FIG. 1A, one having no window region, and one in an embodiment according to the invention which will be described later. In the curve A, there is existed leakage current which flows outside an active layer 3 in a mesa stripe 18 so that current is large as compared to those of the curves B and C measured at the same voltage. The reason of the phenomenon was confirmed in an experiment which was conducted by the inventor that the leakage current was caused in accordance with a structure of the window region 21. Further, an oscillation threshold current was high due to the occurence of the leakage current.

The reasons why the above disadvantages are resulted from the phase shifted-DFB-DC-PBH laser as shown in FIG. 1A will be described in more detail. In FIG. 1C, there is shown a cross-section of the laser in which (111) A-plane 30 is existed on a side surface of the mesa stripe edge 19, and the n-InP substrate 1 and the n-current blocking layer 7 are in contact through the side surface with each other to form an n-n contact. It was also confirmed in the experiment that a leaky current-voltage characteristic as seen in the curve A was obtained because a component of leakage current flowing through the n-n contact was high. The reason why a structure as shown in FIG. 1C was resulted was that crystals were difficult to be grown on (111) A-plane because a wet property was not so good as expected between a melting for liquid phase epitaxy crystal growth and the (111) A-plane 30. In other words, the p-InP current blocking layer 6 which was a first epitaxial layer was begun to be grown only from (100) plane of the n-InP substrate 1 which was a base surface and became approximately flat without covering a whole surface of the (111) A-plane 30 of the n-InP substrate 1. The n-InP current blocking layer 7 which was a second epitaxial layer was grown to be approximately flat in the same manner as in the first epitaxial layer thereby resulting in the aforementioned n-n contact.

In order to avoid the occurence of such a crystal growth, it is important that the (111) A-plane 30 is not exposed on the surface of the mesa stripe edge 19, and that an effective over-saturated temperature of a melting for liquid phase epitaxy crystal growth is made higher so that a crystal growth of the p-InP current blocking layer 6 is improved on the (111) A-plane 30. The inventor found that a width of the mesa stripe 18 is necessary narrowered at the mesa stripe edge 19 for the purpose of the former, and that widths of the grooves 15, 16 and 17 are necessary narrowered in the vicinity of the mesa stripe edge 19 for the purpose of the later. In this case, it is further important that the widths of the grooves 15, 16 and 17 are changed continuously in an axial direction of the laser because, if the widths are changed in a stepping manner, the (111) A-plane 30 is exposed at the stepped portion.

Figure 2A:
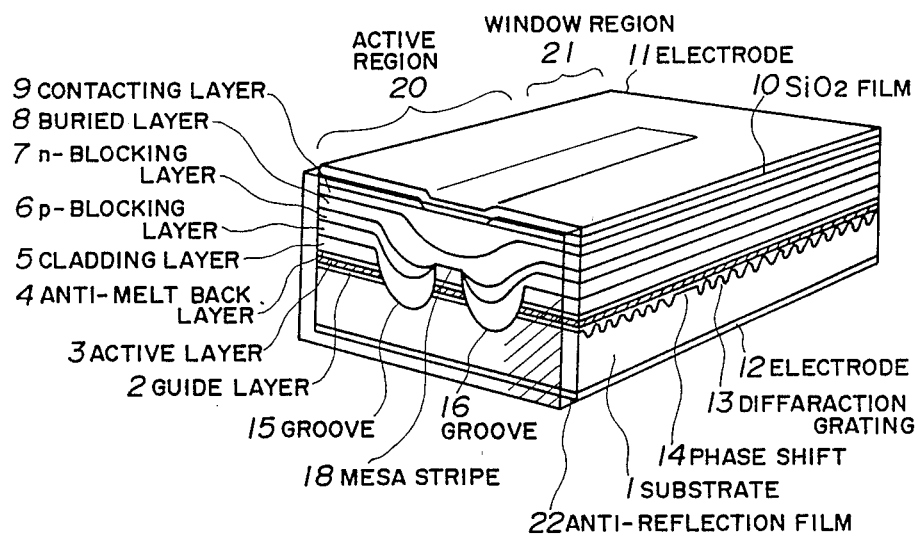
FIG. 2A is a perspective view showing a phase-shifted distributed feedback semiconductor laser in an embodiment according to the invention.
Figure 2B:
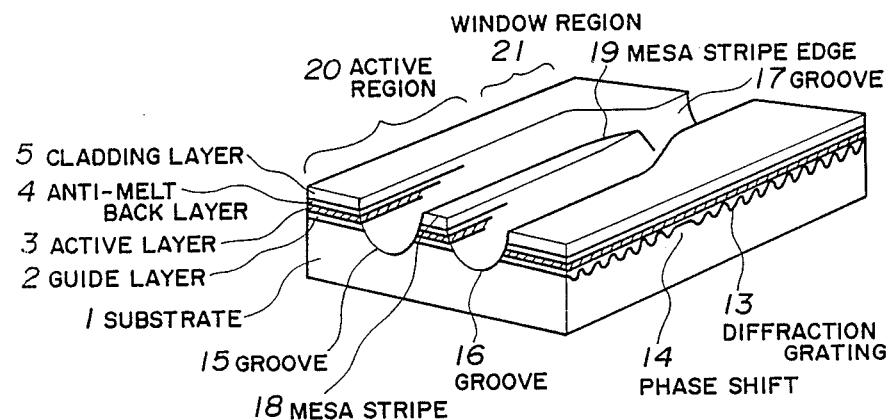
FIG. 2B is a perspective view showing a process for fabricating the phase-shifted distributed feedback semiconductor laser in FIG. 2A.

Next, A DFB-DC-PBH laser in an embodiment according to the invention will be explained in conjunction with FIGS. 2A to 2C. In FIGS. 2A and 2B, there is formed a diffraction grating of a period 2400 Å having a $\lambda/4$ phase shift 14 parallel to a crystal direction of [110] orientation on an n-InP substrate 1 by two beams interferent photo-lithographic method (for instance, as described in Proceedings 29P-T-8, 47th Scientific lecture meeting of the Institute of applied physics, autumn, 1986 by Numai et al). The phase shift 14 is positioned in the center of a portion corresponding to an active region 20 which is a length of 300 µm. Then, a guide layer 2 of n-InGaAsP having a wavelength composition of 1.3 µm and a thickness of 0.1 µm, an active layer 3 of non-doped InGaAsP having a wavelength composition of 1.55 µm and a thickness of 0.1 µm, an anti-melt back layer 4 of non-doped InGaAsP having wavelength composition of 1.3 µm and a thickness of 0.03 µm, and a cladding layer 5 of p-InP having a thickness of 0.5 µm are sequentially grown on a whole surface of the diffraction grating 13 by liquid phase epitaxy. Thereafter, there are formed two parallel semi-circular grooves 15 and 16 each having a width of 4 µm and a depth of 1.5 µm in [110] orientation at a portion corresponding to an active region 20, a mesa stripe 18 having a width of 1.2 µm to be positioned between the grooves 15 and 16, a semi-circular groove 17 having a width of 4 µm and a depth of 1.5 µm along which no mesa stripe is provided, respectively. A feature of the invention is that a structure including the grooves 15, 16 and 17 and the mesa stripe 18 in which a width of the mesa stripe 18 is narrowered in a taper shape at a mesa stripe edge 19, a width of the groove 17 is narrower than the sum of widths of the grooves 15 and 16 and the mesa stripe 18, and widths of the grooves 15 and 16 and of the groove 17 are gradually changed at the mesa stripe edge 19 is provided as clearly understood from the illustration in FIG. 2B. As a result, (111) A-plane is not exposed in the vicinity of the mesa stripe edge 19, and the widths of the grooves 15 and 16 and of the groove 17 can be narrower than those of the conventional structure. Then, a current blocking layer 6 of p-InP having a thickness of 1 µm at a flat portion thereof and a current blocking layer 7 having a thickness of 0.5 µm at a flat portion thereof are sequentially grown on the cladding layer 5 except for a portion above the mesa stripe 18, and a buried layer 8 of p-InP having a thickness of 2 µm at a flat portion thereof and a contacting layer 9 of p+-InGaAsP having a wavelength composition of 1.2 µm and a thickness of 0.5 µm at a flat portion thereof are sequentially grown on a whole surface of the current blocking layer 7 and the cladding layer 5 above the mesa stripe 18. Further, a SiO$_2$ film 10 having a thickness of 3000 Å is grown on the contacting layer 9 by a chemical vapor deposition method, and a window is opened at a portion directly above the mesa stripe 18 on the SiO$_2$ film 10. Thereafter, an electrode 11 of Cr/Au and an electrode 12 of AuGeNi are provided on the upper surface of the SiO$_2$ film 10 and a window thus apertured and on the back surface of the n-InP substrate 1 respectively. Finally, an anti-reflection film of SiN having a thickness of 2200 Å is grown on a facet of one side on which the active region 20 is positioned to be serial with a window region having a length of 50 µm by a plasma chemical vapor deposition method.

Figure 2C:
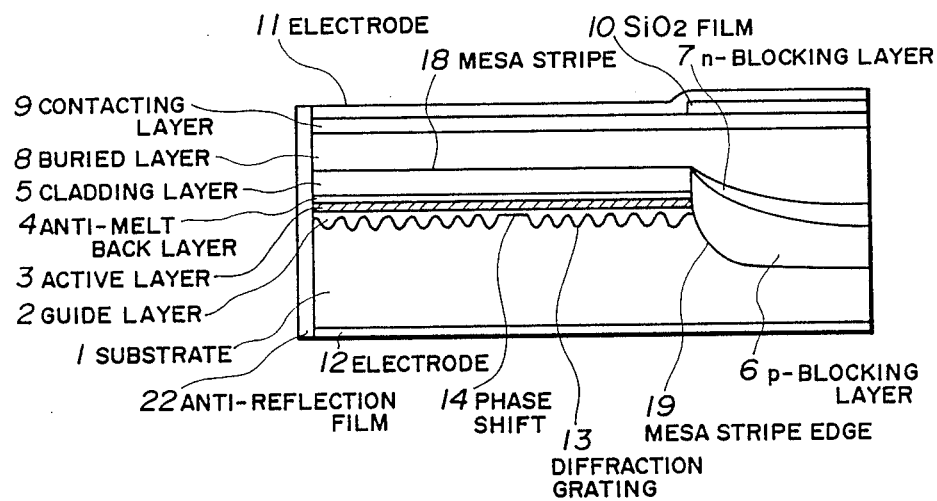
FIG. 2C is a cross-sectional view showing the phase-shifted distributed feedback semiconductor laser in FIG. 2C.

In FIG. 2C, there is shown a cross-section which is cut along the mesa stripe 18 of the phase shifted-DFB-DC-PBH laser as fabricated in the above mentioned manner. As illustrated therein, the crystal growth of the p-InP current blocking layer is sufficiently performed to cover the whole surface of the n-InP substrate 1 not to be exposed at the mesa stripe edge 19 for the reason why no (111) A-plane is substantially exposed at the mesa stripe edge 19, and the widths of the grooves 15 and 16 and of the groove 17 are narrowered at the mesa stripe edge 19 so that a effective over-saturated temperature of a melting for a crystal growth becomes higher than the conventional DFB laser. Therefore, no contact between the n-InP substrate 1 and the n-InP current blocking layer 7 is found in the invention. As described before, a current-voltage characteristic of the phase shifted-DFB-DC-PBH laser in the embodiment is shown in FIG. 3, and it is understood that the curve C is a normal one which is almost equal to the curve B for a DFB laser having no window structure. Further, an oscillation threshold current is as low as 15 to 20 mA, and a single wavelength oscillation is observed in all of one hundred pieces of phase shifted-DFB-DC-PBH lasers which are fabricated in accordance with the embodiment described above.

Although a phase shifted-DFB-DC-PBH laser used in a wavelength band of 1.55 µm is fabricated in the embodiment, a phase shifted-DFB-DC-PBH laser used in another wavelength band of, for instance, 1.3 µm may be fabricated therein. Further, a laser structure other than the structure shown in FIG. 2A to FIG. 2C may be adopted in the invention. As a matter of course, it is not necessary that the diffraction grating 13 is limited to a phase shifted diffraction grating. Still further, although the guide layer 2 is positioned beneath the active layer 3 in the embodiment, the guide layer 2 may be above the active layer 3. In such a case, the anti-melt back layer 4 is not necessary to be provided therein, and the diffraction grating 13 is formed at the boundary between the guide layer 2 and the cladding layer 5.

Although the invention has been described with respect to specific embodiment for complete and clear disclosure, the appended claims are not to thus limited but are to be construed as embodying all modification and alternative construction that may occur to one skilled in the art which fairly fall within the basic teaching herein set forth.

What is claimed is:

1. A distributed feedback semiconductor laser comprising, an optical guide layer of a periodical convex and concave structure provided on a semiconductor substrate of a first conduction type, an active layer for radiating light, said active layer being positioned above said optical guide layer, a cladding layer being positioned above said active layer, first and second grooves each having a depth beyond said active layer, a mesa stripe being positioned between said first and second grooves and terminated at a mesa stripe edge, a third groove having a depth beyond said active layer and being communicated to said first and second grooves at said mesa stripe edge, two current blocking layers of a second conduction type and said first conduction type, said two blocking layers being sequentially provided above said cladding layer, said first and second grooves and said third groove except for above said mesa stripe,
a buried layer being provided above said current blocking layer of said first conduction type, and
electrode means for applying predetermined voltage which is necessary for radiating said light from said active layer,
wherein a width of said mesa stripe is narrowered continuously at said mesa stripe edge in a direction of said third groove, a width of said third groove is narrower than the sum of widths of said first and second grooves and said mesa stripe, and edges of said first and second grooves and of said third groove are defined to be of a continuous shape.

2. A distributed feedback semiconductor laser according to claim 1,
wherein said semiconductor substrate exposed on the surfaces of said first and second grooves and of said third groove is covered on its whole surface with said current blocking layer of said second conduction type.

* * * * *

UNITED STATES PATENT AND TRADEMARK OFFICE
CERTIFICATE OF CORRECTION

PATENT NO. : 4,835,788

DATED : May 30, 1989

INVENTOR(S) : Masayuki Yamaguchi

It is certified that error appears in the above-identified patent and that said Letters Patent is hereby corrected as shown below:

Column 5, line 49, delete "0.5 $\mu$mat" and insert --0.5 $\mu$m at--.

Signed and Sealed this

Thirty-first Day of July, 1990

Attest:

HARRY F. MANBECK, JR.

*Attesting Officer*      *Commissioner of Patents and Trademarks*